United States Patent
Yamamoto

(10) Patent No.: US 6,326,246 B1
(45) Date of Patent: Dec. 4, 2001

(54) METHOD FOR MANUFACTURING THIN FILM TRANSISTOR

(75) Inventor: Mutsuo Yamamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/098,561

(22) Filed: Jun. 17, 1998

Related U.S. Application Data

(62) Division of application No. 08/372,911, filed on Jan. 17, 1995, now Pat. No. 5,811,326.

(30) Foreign Application Priority Data

Jan. 17, 1994 (JP) ........................................... 6-17015

(51) Int. Cl.[7] ............................................... H01L 21/84
(52) U.S. Cl. ............................................ 438/151; 438/585
(58) Field of Search .................................. 438/151, 166, 438/158–164, 585

(56) References Cited

U.S. PATENT DOCUMENTS

| | | | |
|---|---|---|---|
| 4,727,044 | * | 2/1988 | Yamazaki . |
| 5,308,998 | | 5/1994 | Yamazaki et al. ..................... 257/57 |
| 5,395,457 | * | 3/1995 | Sano et al. ........................... 136/256 |
| 5,492,843 | | 2/1996 | Adachi et al. ....................... 437/121 |
| 5,508,209 | | 4/1996 | Zhang et al. .......................... 437/21 |
| 5,523,257 | | 6/1996 | Yamazaki et al. ................... 437/173 |
| 5,529,937 | | 6/1996 | Zhang et al. .......................... 437/41 |
| 5,545,571 | | 8/1996 | Yamazaki et al. ..................... 437/21 |
| 5,576,231 | | 11/1996 | Konuma et al. ....................... 437/41 |
| 5,587,330 | | 12/1996 | Yamazaki .............................. 437/41 |
| 5,663,077 | | 9/1997 | Adachi et al. ....................... 438/151 |
| 5,837,619 | | 11/1998 | Adachi et al. ....................... 438/795 |
| 5,966,594 | | 10/1999 | Adachi et al. ....................... 438/151 |
| 5,985,704 | | 11/1999 | Adachi et al. ....................... 438/166 |
| 6,027,960 | * | 2/2000 | Kusumoto et al. .................. 438/166 |

* cited by examiner

Primary Examiner—Richard Booth
(74) Attorney, Agent, or Firm—Eric J. Robinson; Nixon Peabody LLP

(57) ABSTRACT

In a thin film transistor (TFT), a part of a surface or a whole surface of aluminum used as a gate electrode is covered by anodic oxide. In a process after anodization process, ultraviolet light is irradiated to a gate electrode in an oxidizing atmosphere containing oxygen, ozone, or nitrous oxide. Or, in a process after anodization process, a TFT is leaved (placed) in plasma in an oxidizing atmosphere. Or, ultraviolet light is irradiated to a gate electrode in plasma in an oxidizing atmosphere. A substrate temperature is a room temperature (50° C.) to 500° C., for example, 200 to 300° C. By ultraviolet light irradiation or plasma processing, metallic aluminum contained in anodic oxide is oxidized.

36 Claims, 3 Drawing Sheets

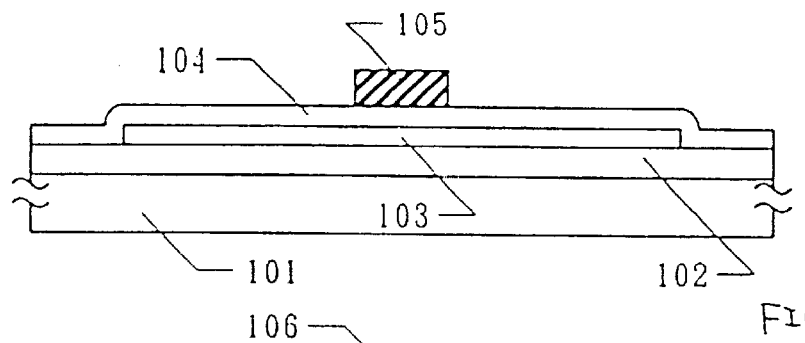
FIG. 1A
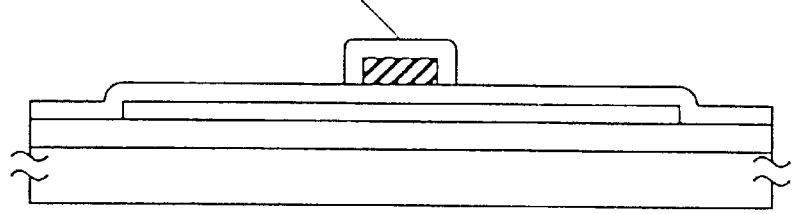
FIG. 1B
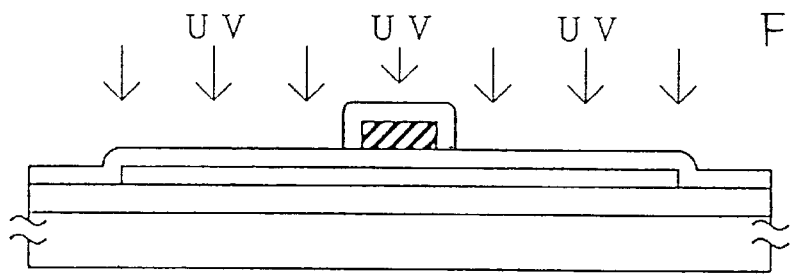
FIG. 1C
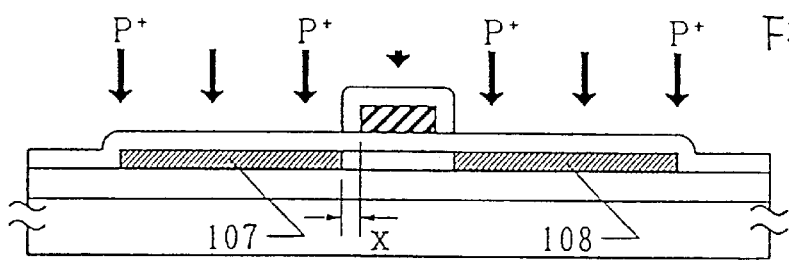
FIG. 1D
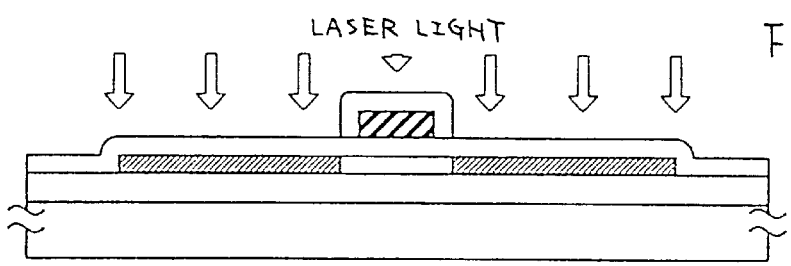
FIG. 1E
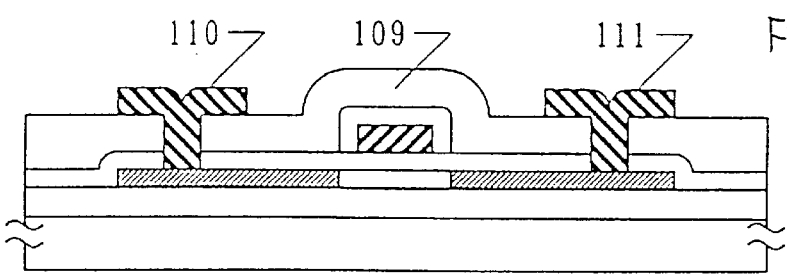

METHOD FOR MANUFACTURING THIN FILM TRANSISTOR

This application is a Divisional of Ser. No. 08/372,911, filed Jan. 17, 1995 now U.S. Pat. No. 5,811,326.

BACKGROUND OF THE INVENTION

1. Field of the Invention

The present invention relates to a method for forming a thin film insulated gate type field effect transistor (thin film transistor, TFT). The TFT formed by the present invention is used as a switching element of a pixel in a liquid crystal display device, or in a semiconductor integrated circuit.

2. Description of the Related Art

In a thin film device such as a thin film insulated gate type field effect transistor, when a gate electrode does not overlap with source and drain regions to obtain an offset state, it is well known that a leakage current between the source and drain regions can be reduced.

In particular, it is desired that an offset region which the gate electrode does not overlap with the source region or the drain region has a width of about sub-micron order and high precision. If the width of the offset region is changed by 0.5 $\mu$m or more, characteristic of a thin film transistor (TFT) has changed entirely. Accordingly, it is desired that the width of the offset region is 0.1 $\mu$m or less, preferably 500 Å or less. However, such precision cannot be obtained in photolithography.

To solve this point, the following method is proposed. That is, a gate electrode is formed by using an anodizable material and anodized, so that anodic oxide having a thickness of 5 $\mu$m or less is formed in at least sides of the gate electrode by precision of 100 Å or less. Using the anodic oxide as a mask, an impurity is introduced by an ion doping, an ion implantation, or the line, to obtain an offset state in self-alignment.

If a gate electrode is formed by a metal material containing mainly aluminum, it is easy to anodize and useful to improve circuit characteristics because of a low resistance. However, if aluminum is anodized, anodic oxide is not stoichiometric oxide ($Al_2O_3$) and has a low oxygen concentration, in general. This means that metallic aluminum contained in the anodic oxide presents isolatedly. Even though such aluminum is matter such as atom, matter such a cluster which a plurality of atoms are collected, or further large lump, electron is easily emitted and it tends toward ionization. Therefore, the anodic oxide tends to attract the electron macroscopically. That is, if the anodic oxide presents on a gate insulating film, since negative charge is inducted in a semiconductor active layer of an offset region formed under the gate insulating film, the offset region becomes an N-type, so that an offset region having an I-type cannot be formed.

From the above, there are a defect that a leakage current between source and drain regions gets large in an N-channel type TFT and an absolute value of a threshold voltage gets high in a P-channel type TFT. Also, since degree of electrolytic dissociation with respect to the metallic aluminum contained in the anodic oxide is changed dependent on an use time of a TFT, there is a defect with respect to reliability that characteristic is not stable.

SUMMARY OF THE INVENTION

An object of the present invention is to solve the above problems.

According to one aspect of the present invention, in a process after anodization process or during processes, ultraviolet light having a wavelength of 400 nm or less, preferably 300 nm or less, is irradiated to a gate electrode in an oxidizing atmosphere containing oxygen, ozone, nitrous oxide. Incoherent light such as a mercury lamp and coherent light such as an excimer laser can be used as a light source of the ultraviolet light.

According to another aspect of the present invention, in a process after anodization process or during processes, a TFT is leaved (placed) in plasma in an oxidizing atmosphere. Plasma can be produced by DC discharge, RF discharge and microwave discharge.

According to another aspect of the present invention, ultraviolet light is irradiated to a gate electrode in plasma in an oxidizing atmosphere. It is further effective when a TFT is heated at a room temperature (50° C.) to 500° C., preferably 200 to 300° C.

By ultraviolet light irradiation or plasma processing, metallic aluminum contained in anodic oxide is oxidized, so that induction of charges in an offset region obtained by the anodic oxide can be decreased, characteristic can be improved, and deterioration by use for a long time can be reduced. In particular, since the offset region gets an N-type, although symmetry of characteristics in an N-channel type TFT and a P-channel type TFT is not preferred in conventional TFTs, ideal TIFTs having preferable symmetry can be obtained by the present invention.

BRIEF DESCRIPTION OF THE DRAWINGS

FIGS. 1A to 1E show a thin film transistor (TFT) forming process according to an embodiment of the present invention;

DETAILED DESCRIPTION OF THE PREFERRED EMBODIMENTS

Embodiment 1

Figure 2A:
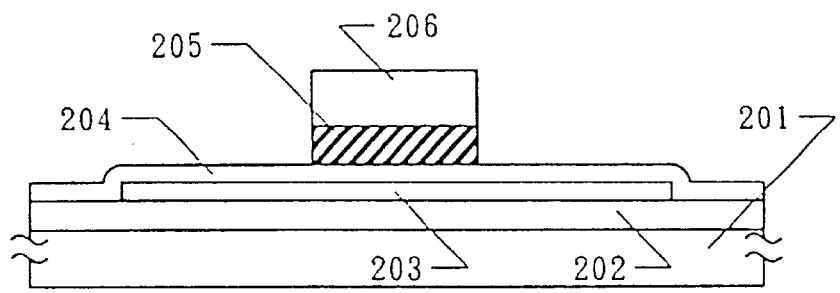
FIGS. 2A–2F show a TFT forming process according to another embodiment of the present invention.

FIGS. 1A to 1E show a thin film transistor (TFT) forming process according to an embodiment of the present invention. A base film 102 of silicon oxide having a thickness of 2000 Å is formed on a substrate (Corning 7059) 101 by a sputtering. Also, by a plasma CVD (Chemical Vapor Deposition), an intrinsic (I-type) amorphous silicon film having a thickness of 200 to 1500 Å, for example, 500 Å, is deposited. Further, by a sputtering, a silicon oxide film having a thickness of 200 Å is formed as a protective film on the amorphous silicon film.

The amorphous silicon film is annealed at 550 to 650° C. for 4 to 48 hours in an atmosphere containing nitrogen to crystallize it. After annealing, the silicon film is patterned to form an island-like silicon region 103 as an active layer. The silicon oxide film used as the protective film is removed. Further, by a plasma CVD, a silicon oxide film 104 having a thickness of 800 to 2000 Å, for example, 1000 Å, is deposited as a gate insulating film.

By a sputtering, an aluminum film (containing scandium (Sc) of 0.1 to 0.3 weight %) having a thickness of 3000 to 8000 Å, for example, 4000 Å, is deposited. It is desired that forming processes of the silicon oxide film and the aluminum film are performed successively. By a known photolithography, a gate electrode (silicon doped aluminum) 105 is patterned. (FIG. 1A)

The substrate is immersed into a solution containing citric acid, oxalic acid, phosphoric acid, chromic acid, sulfuric acid or the like, of 3 to 20%, for example, a solution containing oxalic acid of 10%. Anodization is performed at a constant voltage of 10 to 50 V, for example, 10 V, for 10 to 50 minutes, for example, 30 minutes, so that porous anodic oxide (aluminum oxide) 106 having a thickness of about 3000 Å can be formed in upper and side surfaces of a gate electrode by precision of ±200 Å or less. A thickness of the obtained anodic oxide is controlled mainly by an anodization time.

Anodization may be performed by using an organic solvent such as an ethylene glycol solution containing at least one of tartaric acid, boric acid, and nitric acid, of 3 to 10%. For example, the substrate is immersed into an ethylene glycol solution (pH-prepared in neutral by using ammonia) containing tartaric acid of 3%, and a current is supplied into the substrate to perform anodization. A voltage is increased until 120 to 200 V at a rate of 4 V/minute. As a result, fine anodic oxide which is called a barrier type is formed. A thickness of the anodic oxide is determined by a maximum oxide voltage. Although porous anodic oxide gets thick easily, a withstanding voltage of the porous anodic oxide is low in comparison with the barrier type. On the other hand, a withstanding voltage of the barrier type anodic oxide is half of or higher than the maximum oxide voltage, in general, 50 to 100 V or higher. However, in order to obtain barrier type anodic oxide having a thickness of 3000 Å or more, the maximum oxide voltage must be set to 250 V or higher. Therefore, when such high voltage is applied, since dielectric breakdown produces between a gate electrode and an active layer, anodic oxide having a thickness thicker than 2500 Å cannot be obtained.

An anodization manner to be used is determined by a necessary withstanding voltage and a thickness of anodic oxide (a width of an offset region). the necessary withstanding voltage and the thickness of the anodic oxide may be obtained by using porous anodic oxide and barrier type anodic oxide without using only one type anodic oxide (monolayer). (FIG. 1B)

After the anodic oxide is formed, the substrate is washed by using pure water, dried after an electrolytic solution is removed, placed in an oxidizing atmosphere containing oxygen, ozone, nitrous oxide ($N_2O$) and the like, and is irradiated with ultraviolet light.

After the substrate is placed into a treatment bath made of quarts and vacuum exhaust is performed, ultraviolet light by a mercury lamp is irradiated in 0.01 to 1 atmospheric pressure, preferably 0.05 to 0.1 atmospheric pressure at a substrate temperature of a room temperature (50° C.) to 500, preferably 200 to 300° C. while an oxygen gas ($O_2$) is supplied at a rate of 1 to 10 liter/minute, for example, 1 liter/minute. An intensity of the ultraviolet light is 100 to 200 mW/cm². A treatment time is 10 minutes to 3 hours, for example, 30 minutes. In stead of pure oxygen gas, when an oxygen gas which is treated by an ozonizer and contains ozone ($O_3$) is used, it is further effective to shorten the treatment time. Also, in stead of irradiation of the ultraviolet light, when RF plasma is produced in the above oxidizing atmosphere, it is confirmed that the same effect is obtained. (FIG. 1C)

By a plasma doping, a doping impurity (phosphorus) is implanted (introduced) into he silicon region 103 by using the gate electrode and the anodic oxide 106 as masks in a self-alignment. A doping gas is phosphine ($PH_3$). An accelerating voltage is 60 to 90 kV, for example, 80 kV. A dose is $1 \times 10^{14}$ to $8 \times 10^{15}$ cm$^{-2}$, for example, $1 \times 10^{15}$ cm$^{-2}$. As a result, an N-type impurity regions 107 and 108 are formed. The impurity regions 107 and 108 is apart from the gate electrode 105 by a thickness x of anodic oxide, and an offset state is obtained. (FIG. 1D)

Laser is irradiated from the upper side of a substrate, so that annealing is performed and the doped impurity in the impurity regions 107 and 108 is activated. The laser is KrF excimer laser (wavelength of 248 nm and pulse width of 30 ns). XeCl excimer laser (wavelength of 308 nm). ArF excimer laser (wavelength of 193 nm), XeF excimer laser (wavelength 353 nm) or the like may be used. An energy density of the laser is 200 to 400 mJ/cm², for example, 250 mJ/cm². The number of shots is 2 to 10 shots, for example, 2 shots. During laser irradiation, a substrate is heated at 200 to 300° C., for example, 250° C. (FIG. 1E)

A silicon oxide film 109 having a thickness of 3000 to 8000 Å, for example, 6000 Å, is formed as an interlayer insulator by a plasma CVD. Contact holes are formed in the silicon oxide film 109. Electrode-wirings 110 and 111 in source and drain regions of a TFT are formed by a multilayer of metal materials, for example, titanium nitride and aluminum. Annealing is performed at 350° C. for 30 minutes in an atmosphere containing hydrogen in 1 atmosphere pressure. By the above processes, a TFT is completed. (FIG. 1F)

Embodiment 2

FIGS. 2A to 2E show a TFT forming process according to another embodiment of the present invention. A base film 202 of silicon oxide having a thickness of 2000 Å is formed on a substrate (Corning 7059) 201 by a sputtering. Also, an intrinsic (I-type) amorphous silicon film having a thickness of 200 to 1000 Å, for example, 500 Å, is deposited by a plasma CVD, and patterned and etched to form an island-like silicon region 203 as an active layer. Laser light (KrF excimer laser) is irradiated to crystallize the silicon region 203. Further, by a sputtering, a silicon oxide film 204 having a thickness of 1000 Å is formed as a gate insulating film.

By a sputtering, an aluminum film (containing scandium of 0.1 to 0.3 weight %) having a thickness of 3000 to 8000 Å, for example, 4000 Å, is deposited. The substrate is immersed into an ethylene glycol solution which pH is approximately 7 by neutralizing tartaric acid of 3% using ammonia, and a voltage of 10 to 30 V is applied to form thin anodic oxide having a thickness of 100 to 400 Å on a surface of the aluminum film. On such treated aluminum film, a photoresist (for example, a product of Tokyo Ohka company Co. Ltd, OFPR800/30cp) having a thickness of about 1 μm is formed by a spin coating. In stead of such photoresist, a photosensitive polyimide (photoneece) such as a product of Toray industries Inc. (UR3800) may be used. By a known photolithography, a gate electrode 205 is formed. On the gate electrode 205, a mask 206 used as a photoresist remains. (FIG. 2A)

Figure 2B:
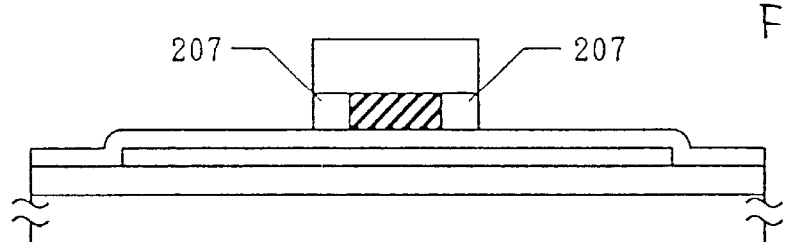

The substrate is immersed into a solution containing oxalic acid of 10%. Anodization is performed at a constant voltage of 5 to 50 V, for example, 8 V, for 10 to 500 minutes, for example, 200 minutes, so that: porous anodic oxide 207 having a thickness of about 5000 Å can be formed in sides of the gate electrode 205 by precision of ±200 Å or less. Since the mask 206 is formed on an upper surface of the gate electrode 205, anodization is not almost proceeded. (FIG. 2B)

Figure 2C:
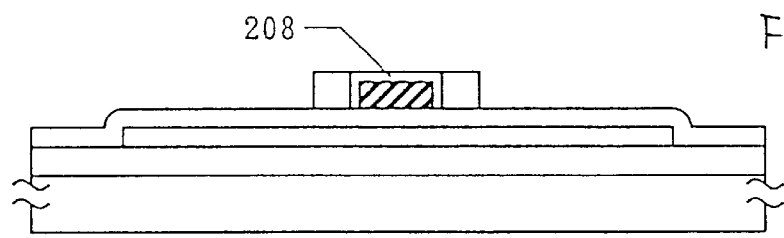

The upper surface of the gate electrode 205 is exposed by removing the mask 206. The substrate is immersed into an ethylene glycol solution (pH-prepared in neutral by using ammonia) containing tartaric acid of 3%, and a current is supplied into the substrate to perform anodization. A voltage is increased until 100 V at a rate of 1 to 5 V/minute, for example, 4 V/minute. As a result, not only the upper surface of the gate electrode 205 but also the sides of the gate electrode 205 are anodized, so that fine barrier type anodic oxide 208 having a thickness of 1000 Å is formed in the upper surface of the gate electrode 205 and in a boundary between the sides of the gate electrode 205 and porous anodic oxide 207. A withstanding voltage of the anodic oxide 208 is 50 V or higher. (FIG. 2C)

The silicon oxide film 204 is etched by a dray etching. This etching may include a plasma mode of isotropic etching or a reactive ion etching mode of anisotropic etching. It is important not to etch deeply the active layer 203 by sufficiently increasing a selection ratio of silicon and silicon oxide, that is, by enlarging a difference between an etching rate of silicon and that of silicon oxide. When an etching gas is $CF_4$, the porous anodic oxide 207 and the barrier type anodic oxide 208 are not etched and only the silicon oxide film is etched. Note that the silicon oxide film formed under the gate electrode 205 is not etched and remains as a gate insulating film 203'.

Figure 2D:
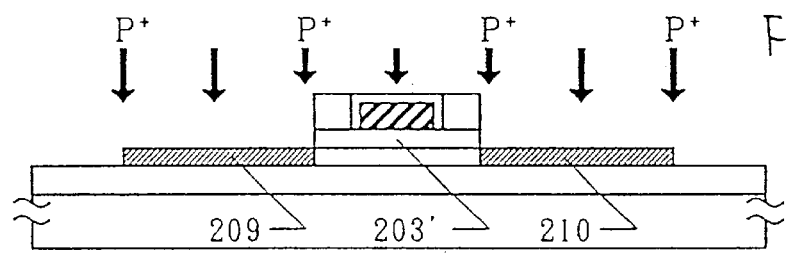

By a plasma doping, an impurity (phosphorus) is implanted into the active layer 203 using the gate electrode 205 and the porous anodic oxide 207 as masks in self-alignment. A doping gas is phosphine ($PH_3$). An accelerating voltage is 5 to 30 kV, for example, 10 kV. A dose Ls $1\times10^{14}$ to $8\times10^{15}$ cm$^{-2}$, for example, $1\times10^{15}$ cm$^{-2}$. In the embodiment, since an oxide film covering the active layer is removed, an accelerating voltage for doping may be low. As a result, N-type impurity regions 209 and 210 are formed. (FIG. 2D)

Using a mixing acid containing phosphoric acid, acetic acid, nitric acid, porous anodic oxide 207 is etched to expose barrier type anodic oxide 208. In etching, only porous anodic oxide is etched, materials such as silicon oxide, silicon, and barrier type anodic oxide are not etched. Also, although aluminum and its alloy are etched in general, since the upper and side surfaces of the gate electrode are covered by the barrier type anodic oxide in the embodiment, these are not damaged (etched). If the barrier type anodic oxide is too thin, etching is performed, it is desired that a thickness of the barrier type anodic oxide is 200 Å or more.

Figure 3A:
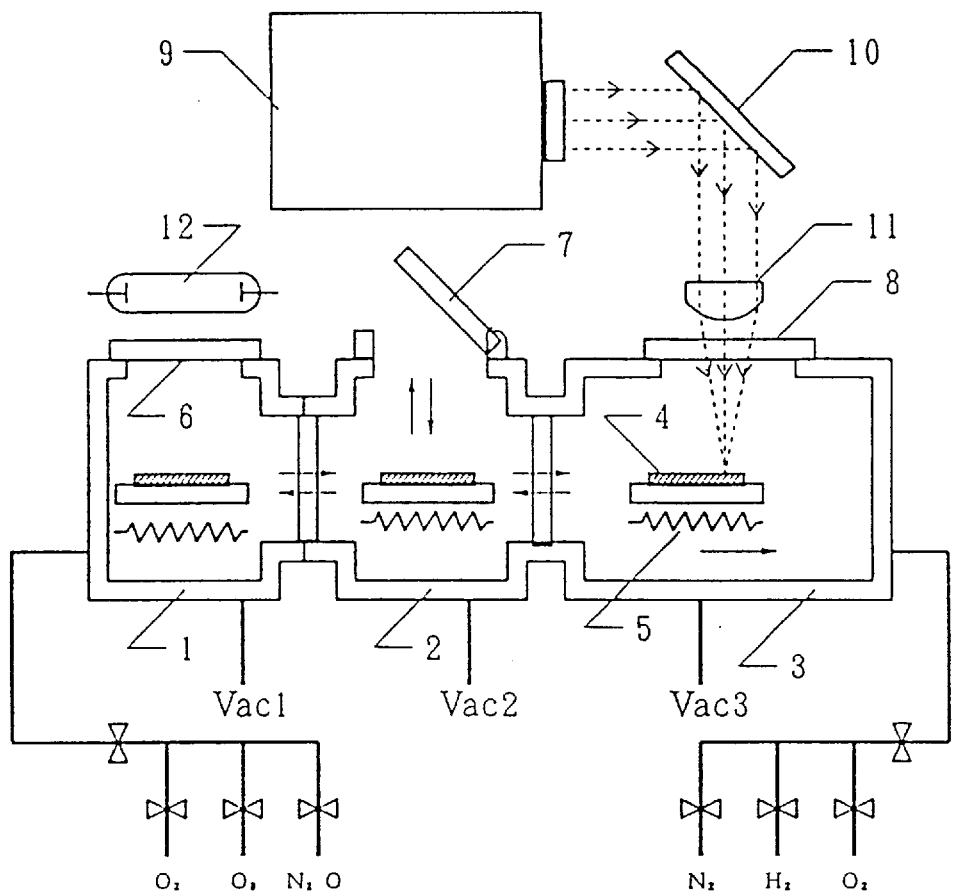
FIGS. 3A and 3B are a schematic view of the apparatus according to the present invention and an upper view of the apparatus.
Figure 3B:
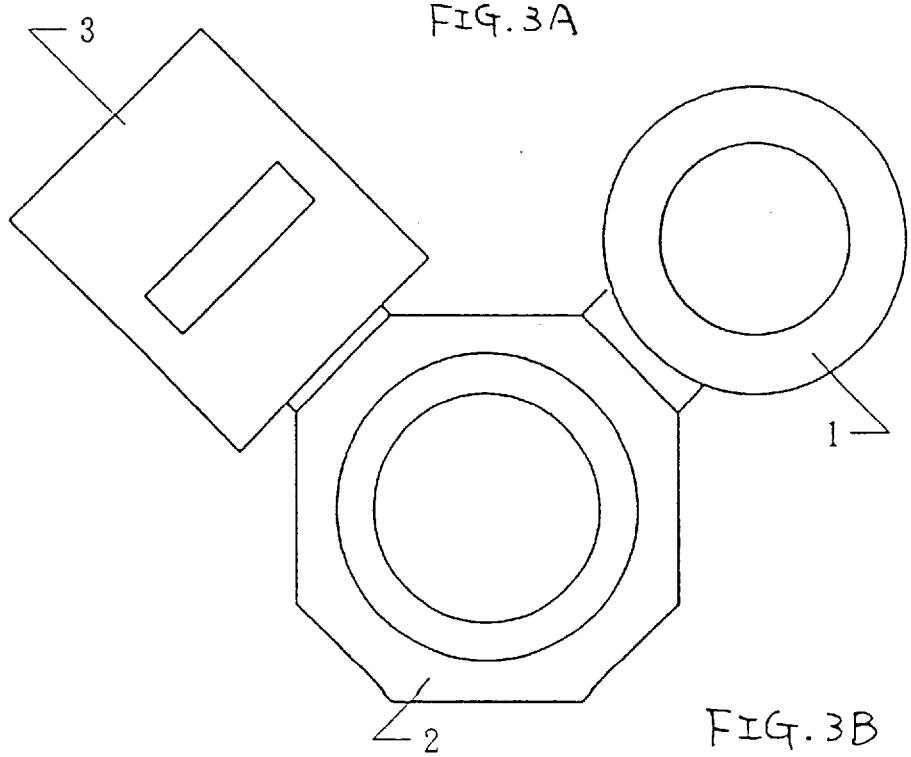

The substrate is placed in an apparatus having a plurality of processing chambers as shown in FIGS. 3A and 3B. FIG. 3A is a schematic view of the apparatus, and FIG. 3B is an upper view of the apparatus. The apparatus has three chambers. A chamber 1 is a chamber used to irradiate ultraviolet light. A chamber 2 is a preparative chamber to set or take out the substrate 4. A chamber 3 is a chamber for laser annealing.

In FIG. 3A, each chamber has a vacuum exhaust apparatus, independently. In the chamber 1, oxygen gas, nitrous oxide, and ozone gas are supplied from an oxygen bottle, a nitrous oxide bottle, and an ozonizer, respectively. In the chamber 3, nitrogen, hydrogen, and oxygen are supplied from each bottle. In the chamber 2, a door 7 for taking in and out the substrate is arranged. The chamber 3 can store three substrate at maximum. The substrate is placed on a substrate holder 5 with a heater and transferred among each chamber.

In the chambers 1 and 3, windows 6 and 8 made of quartz are arranged. A mercury lamp 12 is arranged in outside of the chamber 1. Further, as not shown in FIG. 3A, RF electrodes are arranged in the chamber 1 to produce RF discharge in the chamber 1. In the chamber 3, laser light emitted from an excimer laser generating apparatus 9 is irradiated into the chamber 3 through a mirror 10, a lens 11 and the like.

In the apparatus, after the substrate is set in the chamber 2, the substrate is transferred to the chamber 1 and irradiated with ultraviolet light. Next, after the substrate is returned to the chamber 2, the substrate is transferred to the chamber 3 and annealed with laser light. After that, the substrate is returned to the chamber 2 and taken out. Ultraviolet light irradiation and laser annealing processes are performed by using the apparatus.

In the chamber 1, while oxygen gas ($O_2$) is supplied at 0.1 to 10 liter/minute, for example, 1 liter/minute, it is maintained in 0.01 to 1 atmosphere pressure, preferably 0.05 to 0.1 atmosphere pressure at: a substrate temperature of a room temperature (50° C.) to 500° C., preferably, 200 to 300° C. Also, an RF power having 10 to 100 W, for example, 50 W is supplied to produce discharge in an atmosphere. Further, ultraviolet light is irradiated by a mercury lamp. An intensity of the ultraviolet light is 100 to 200 mW/cm$^2$. Treatment time is 5 to 30 minutes, for example, 10 minutes.

Figure 2E:
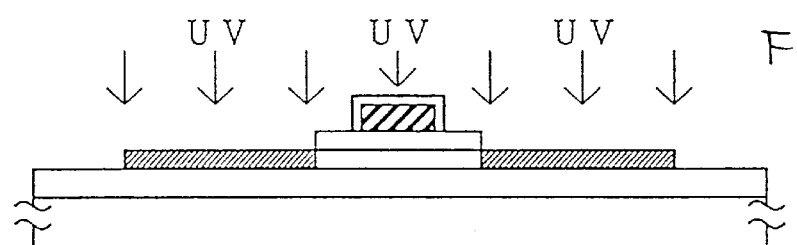
Figure 2F:
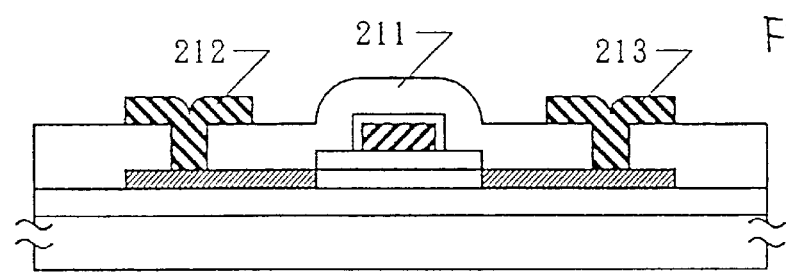

After that, the substrate is transferred to the chamber 3 and irradiated with laser light, so that laser annealing is performed to activate the doped impurity. In the embodiment, since the laser light is also irradiated into a boundary between the doped impurity region and the offset region, generation of a level in a boundary portion can be suppressed. (FIG. 2E)

A silicon oxide film 211 having a thickness of 5000 Å is formed as an interlayer insulator by a plasma CVD. Contact holes are formed in the silicon oxide film 211, and electrode-wirings 212 and 213 in source and drain regions of a TFT are formed by a multilayer of metal materials, for example, titanium nitride and aluminum. Annealing is performed at 350° C. for 30 minutes in an atmosphere containing hydrogen at 1 atmosphere pressure. By the above processes, a thin film transistor is completed. In the embodiment, a width of an offset region is about 6000 Å obtained by adding a width of the porous anodic oxide (5000 Å) to a thickness of the barrier type anodic oxide (1000 Å).

As described above, by the present invention, a TFT having superior reliability and characteristic can be obtained in comparison with a TFT formed by a conventional method. In Embodiment 3, a TFT forming process is performed by using the apparatus having a plurality of chambers, as shown in FIGS. 3A and 3B. In order to further decrease the cost of equipment, ultraviolet light irradiation may be performed in a chamber used for laser annealing. In general, this chamber has a quarts window and ultraviolet light can be incident to the chamber through the quarts window.

The present invention can be embodied by a plasma processing apparatus used in ashing process. Also, a chamber of the present invention may be connected with a chamber used in a plasma CVD apparatus, a chamber used in a sputtering apparatus, and a chamber used in a doping apparatus.

In the present invent ion, the cost of equipment can be changed in accordance with an embodying equipment, and its effect is larger than an effect proportional to the cost. The present invention is useful in industry.

What is claimed is:

1. A method for forming a thin film transistor comprising the steps of:
   preparing an apparatus comprising an evacuable chamber;
   placing a substrate over which at least a semiconductor film and a gate electrode are formed in said evacuable chamber;
   anodizing gate electrode; and
   irradiating said substrate with a laser in an oxidizing atmosphere at an atmospheric pressure in said evacuable chamber to oxidizing a portion of said gate electrode.

2. The method of claim 1 wherein said irradiating step is to activate an impurity doped into the semiconductor film.

3. A method for forming a thin film transistor comprising the steps of:
   forming a semiconductor film comprising silicon over a substrate;
   crystallizing said semiconductor film;
   forming a gate electrode adjacent to said semiconductor film with a gate insulating film interposed therebetween;
   anodizing said gate electrode;
   doping an impurity element into said semiconductor film for forming at least one impurity region;
   placing said substrate with at least said semiconductor film and said gate electrode formed thereover, into a chamber containing therein oxygen; and
   irradiating laser light or ultraviolet light to said substrate to oxidize a portion of said gate electrode.

4. The method of claim 3 wherein said crystallizing is performed by irradiating laser light to said semiconductor film.

5. The method of claim 3 wherein said crystallizing is performed at 550 to 650° C. for 4 to 48 hours.

6. The method of claim 3 wherein said impurity element is phosphorus.

7. The method of claim 3 wherein said chamber further contains therein at least one gas selected from nitrous oxide, ozone, nitrogen and hydrogen.

8. The method of claim 3 wherein an inside of said chamber is maintained at 0.01 to 1 atmosphere pressure.

9. The method of claim 3 wherein a temperature of said substrate is 50 to 500° C.

10. A method for forming a thin film transistor comprising the steps of:
    forming a semiconductor film comprising silicon by using a CVD method, over a substrate;
    crystallizing said semiconductor film;
    forming a gate electrode by using a sputtering method, adjacent to said semiconductor film with a gate insulating film interposed therebetween;
    anodizing said gate electrode;
    doping an impurity element into said semiconductor film for forming at least one impurity region;
    placing said substrate with at least said semiconductor film and said gate electrode formed thereover, into a chamber containing therein oxygen; and
    irradiating laser light emitted from an apparatus to said substrate to oxidize said portion of a gate electrode.

11. The method of claim 10 wherein said crystallizing is performed by irradiating laser light to said semiconductor film.

12. The method of claim 10 wherein said crystallizing is performed at 550 to 650° C. for 4 to 48 hours.

13. The method of claim 10 wherein said impurity element is phosphorus.

14. The method of claim 10 wherein said chamber further contains therein at least one gas selected from nitrous oxide, ozone, nitrogen and hydrogen.

15. The method of claim 10 wherein an inside of said chamber is maintained at 0.01 to 1 atmosphere pressure.

16. The method of claim 10 wherein a temperature of said substrate is 50 to 500° C.

17. A method for forming a thin film transistor comprising the steps of:
    forming a semiconductor film comprising silicon by using a CVD method, over a substrate;
    crystallizing said semiconductor film;
    forming a gate electrode by using a sputtering method, adjacent to said semiconductor film with a gate insulating film interposed therebetween;
    anodizing said gate electrode;
    doping an impurity element into said semiconductor film for forming at least one impurity region;
    irradiating to said substrate with at least said semiconductor film and said gate electrode formed thereover, in an oxidizing atmosphere to oxidize a portion of said gate electrode.

18. The method of claim 17 wherein said crystallizing is performed by irradiating laser light to said semiconductor film.

19. The method of claim 17 wherein said crystallizing is performed at 550 to 650° C. for 4 to 48 hours.

20. The method of claim 17 wherein said impurity element is phosphorus.

21. The method of claim 17 wherein said oxidizing atmosphere includes at least one gas selected from oxygen, nitrous oxide and ozone.

22. The method of claim 17 wherein a temperature of said substrate is 50 to 500° C.

23. A method for forming a thin film transistor comprising the steps of:
    forming a semiconductor film comprising silicon by using a CVD method, over a substrate;
    crystallizing said semiconductor film;
    forming a gate electrode by using a sputtering method, adjacent to said semiconductor film with a gate insulating film interposed therebetween;
    anodizing said gate electrode;
    doping an impurity element into said semiconductor film for forming at least one impurity region;
    irradiating ultraviolet light to said substrate with at least said semiconductor film and said gate electrode formed thereover, in an oxidizing atmosphere to oxidize a portion of said gate electrode.

24. The method of claim 23 wherein said crystallizing is performed by irradiating laser light to said semiconductor film.

25. The method of claim 23 wherein said crystallizing is performed at 550 to 650° C. for 4 to 48 hours.

26. The method of claim 23 wherein said impurity element is phosphorus.

27. The method of claim 23 wherein said oxidizing atmosphere includes at least one gas selected from oxygen, nitrous oxide and ozone.

28. The method of claim 23 wherein a temperature of said substrate is 50 to 500° C.

29. The method of claim 3 wherein said irradiating step is performed in plasma.

30. The method of claim 10 wherein said irradiating step is performed in plasma.

31. The method of claim 17 wherein said irradiating step is performed in plasma.

32. The method of claim 23 wherein said irradiating step is performed in plasma.

33. The method of claim 3 wherein said gate electrode is formed over said semiconductor film with a gate insulating film interposed therebetween.

34. The method of claim 10 wherein said gate electrode is formed over said semiconductor film with a gate insulating film interposed therebetween.

35. The method of claim 17 wherein said gate electrode is formed over said semiconductor film.

36. The method of claim 3 wherein said gate electrode is formed over said semiconductor film.

* * * * *